United States Patent [19]

Kolber

[11] Patent Number: 4,566,110
[45] Date of Patent: Jan. 21, 1986

[54] AUTO-ZEROING LINEAR ANALOG TO DIGITAL CONVERTER APPARATUS AND METHOD

[75] Inventor: Steven Kolber, Boca Raton, Fla.

[73] Assignee: Coulter Electronics, Inc., Hialeah, Fla.

[21] Appl. No.: 419,696

[22] Filed: Sep. 17, 1982

[51] Int. Cl.⁴ ............................................. H03M 1/06
[52] U.S. Cl. ......................................... 377/10; 377/30; 422/91; 356/246
[58] Field of Search .............. 377/10, 28, 30; 340/347 CC; 356/419, 246; 364/555; 422/64, 91

[56] References Cited

U.S. PATENT DOCUMENTS

| 2,824,285 | 2/1958 | Hunt | 340/347 CC |
| 3,445,839 | 5/1969 | Engelberg et al. | 340/347 CC |
| 3,506,818 | 4/1970 | Smith | 340/347 CC |
| 3,609,047 | 9/1971 | Marlow | 356/419 |
| 3,641,563 | 2/1972 | Cushman | 340/347 CC |
| 3,668,690 | 6/1972 | Ormond | 340/347 CC |
| 3,737,893 | 6/1973 | Belet et al. | 340/347 CC |
| 4,059,405 | 11/1977 | Sodickson | 422/66 |
| 4,234,539 | 11/1980 | Ginsberg et al. | 356/246 |
| 4,305,723 | 12/1981 | Kolber et al. | 356/434 |
| 4,308,231 | 12/1981 | Kolber et al. | 422/64 |

Primary Examiner—John S. Heyman
Assistant Examiner—Karl Ohralik
Attorney, Agent, or Firm—Silverman, Cass & Singer, Ltd.

[57] ABSTRACT

Offset-error included data normally is output from a single ramp analog to digital converter in response to input information applied thereto during light or cuvette sample intervals. During dark sample intervals between the cuvette sample intervals, the input information is blocked from the converter and the converter is operated with the output counter counting down to a dark count representing the offset error of the counter. During the next cuvette sample interval the counter counts up from the dark count effectively subtracting out the offset error introduced by the converter.

24 Claims, 3 Drawing Figures

FIG. 1

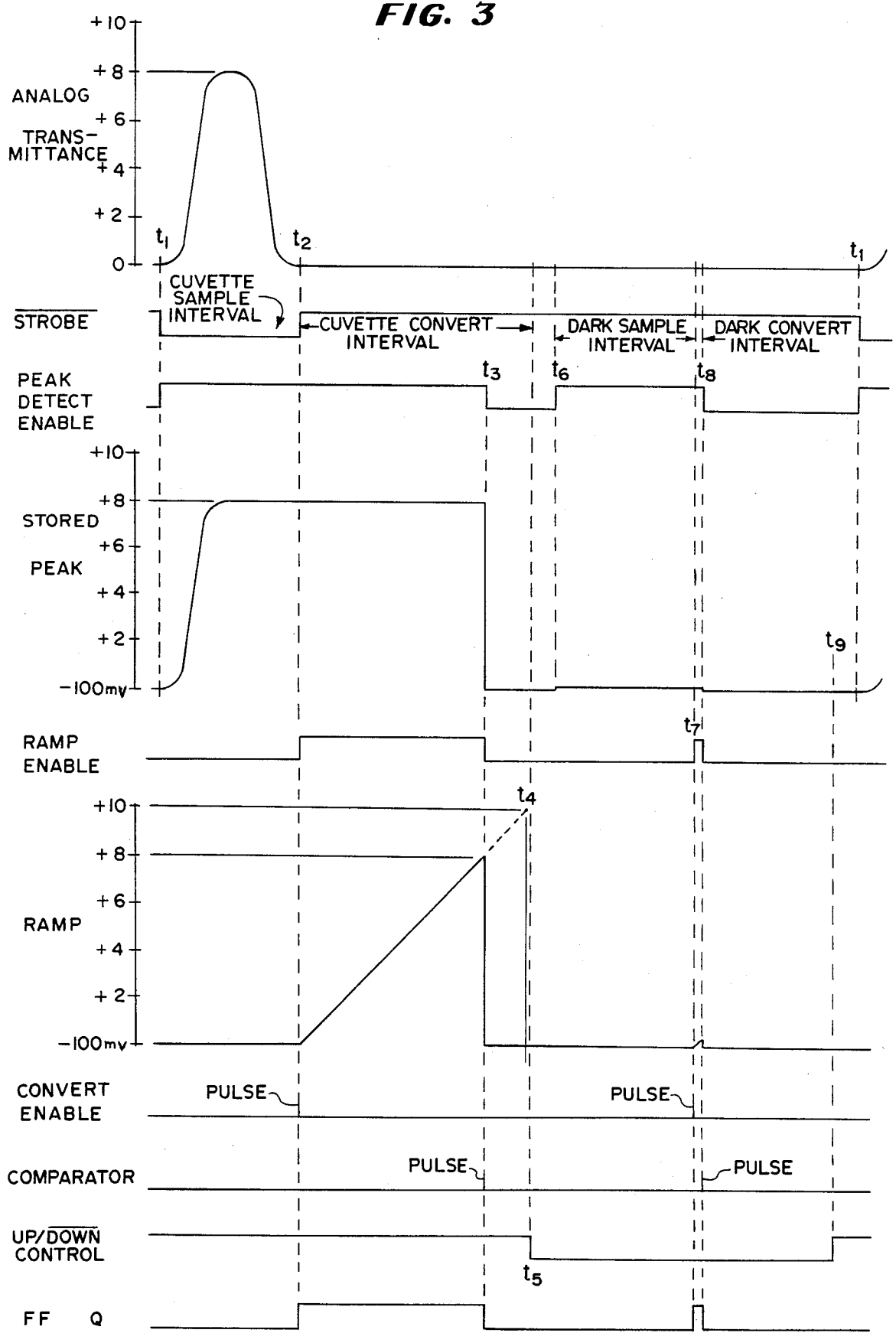

AUTO-ZEROING LINEAR ANALOG TO DIGITAL CONVERTER APPARATUS AND METHOD

BACKGROUND OF THE INVENTION

The invention relates to linear analog to digital converters and further to the use of such a converter in an apparatus and method for measuring repeatedly the absorption of electromagnetic radiation by a plurality of specimens over a period of time. More particularly this invention concerns an apparatus and method in which each of a plurality of fluid samples or aliquots (portions of the samples) in reaction vessels or cuvettes is subjected to chemical reaction with different reagents. The electromagnetic transmittance of each aliquot repeatedly is determined during the reaction period. The measurement herein involves accurately ascertaining the value of electromagnetic radiation transmittance at a particular wavelength by the fluids in the cuvettes and converting the signals from an analog to a digital form so that digital transmission, conversion to absorbance data, storage and processing may occur.

It is desirable to make such an analysis on a continuous process in which the apparatus continues to operate as long as there are samples to be tested, the old samples and their tested aliquots being replaced by new samples and their aliquots without interruption of the operation of the testing apparatus. Such continuous operation includes one or more photometric measurements on a given aliquot by one or more photometers. It is preferably that the analog transmittance signals received each time a reaction vessel passes through a light beam be converted into digital transmittance signals that thereafter are transmitted to a central processor where they are converted into digital absorbance signals.

The continuous analyzers of interest typically supply sample portions to reaction vessels which are monitored by measuring the transmission of light by the fluids in the cuvettes at a particular wavelength or wavelengths. Sample fluids placed in cuvettes typically are body fluids of a specific patient with one or more tests related to the patient's condition of health being conducted. It is therefore critical that the signals obtained from the fluids in the cuvettes be both accurate and repeatable. The sampling of the transmittance signals and therefrom the production of the absorbance data of each aliquot should be precisely repeatable for each cuvette and each light beam passing through the cuvette.

Analog to digital (A/D) conversion of electrical signals such as the transmittance signals herein is well known. In a simple single-ramp A/D converter the unknown voltage level signal, the level of which is to be digitized, is applied to one of a pair of inputs of a comparator. A fixed or constant slope ramp signal from an integrator is applied to the other comparator input. A constant frequency clock signal is gated to a counter at the beginning of the ramp signal slope and is stopped when the ramp signal equals the voltage level of the unknown voltage level signal, as determined by the comparator. The count in the counter then represents the digital conversion of the unknown voltage level.

Such a single-ramp type of converter is one of the simplest circuits available for performing the A/D conversion. It suffers, however, from several errors that affect its accuracy: the slope of the ramp signal may vary over each cycle; the frequency of the clock signal may vary; and the comparator may introduce propagation delay intervals and offset voltages.

Thus, in applications involving A/D converters, the two words "simple" and "accurate" usually are contradictory. The simpler the circuit the less accurate, and the more accurate the circuit the less simple. The word "accurate" generally refers to longer data words representing the desired information; thus a 16 bit data word is more accurate in representing voltage values of a range of say 0-10 volts than a 4 or 10 bit data word.

Motorola Application Note AN-559, "A SINGLE RAMP ANALOG TO DIGITAL CONVERTER", Jim Barnes, Applications Engineer describes modifications to overcome some of the inaccuracies introduced by a single-ramp A/D converter. One described circuit provides twin comparators. One senses the ramp signal slope passing through a start level at which time the clock frequency is gated to the counter. The other senses the ramp signal equaling the unknown voltage level signal to stop the counter. This reduces ramp start and stop time variations caused by comparator offset voltage and propagation delay errors.

Another described circuit performs a comparison to a known standard for each measurement cycle. A known voltage level reference signal is applied to the A/D converter and a digital result is obtained. The digital result is compared to the known correct result for the reference signal. The difference between the obtained and known result is used to adjust the frequency of the clock signal that is gated to the counter. After adjustment, the reference signal is switched from the converter and the unknown voltage level signal is applied thereto and digitized.

In effect, this Application Note indicates the need to provide additional circuitry to overcome the inaccuracies introduced by the simple single-ramp A/D converter.

Multiple ramp A/D converters also are available to provide increased accuracy.

Dual-ramp A/D converters are especially suitable in digital voltmeters and those applications in which a relatively lengthy time may be taken to obtain the benefits of noise reduction through signal averaging.

Such a converter operates by applying the unknown signal to an integrator and starting a counter counting clock pulses. After a fixed interval of time, a reference voltage having opposite polarity is applied to the integrator and the counter again begins counting from zero. When the integrator output reaches zero the counter is stopped and its output is the binary representation of the input voltage. A circuit diagram of such a dual ramp circuit is located in "Analog-Digital Converter Notes", Analog Devices, Inc., 1977, Chapter 11-1, page 123.

A shortcoming of conventional dual-ramp converters is that errors introduced at the input to the integrator or comparator become errors in the digital count. Such errors may be reduced by charging a capacitor with such zero-drift errors during a third cycle of the measurement and introducing the stored charge in the opposite sense during the integration interval to nullify the errors.

U.S. Pat. No. 3,872,466 discloses a quad-ramp circuit for reducing errors due to offset voltages in A/D converters. An integrator is ramped up to and down from a reference level during a calibrate operation by sequential application of opposite polarity reference signals. A digital determination of net offset error is made by comparing the total time of ramp up and down with a fixed time period set by a clock generator. During a subsequent conversion operation, the unknown voltage level analog signal is integrated over up and down ramps with the interval of integration being adjusted by the net offset error. Four integration intervals always are required for each measurement.

Substantially more circuitry is required for the dual- and quad-ramp A/D converter circuits than for the single-ramp circuit, and offset error correction in both the dual- and quad-ramp circuits is complicated.

The apparatus of the invention includes presenting transmittance digital data in the form of 16 parallel binary bits. A transmittance value of 100% is represented by $2^{16}$ or 65,536 A to D units (ADU) while a transmittance value of 1% is presented as 655 ADU. A full scale analog transmittance signal is 10 volts with a least significant bit (LSB) weighing of 152 microvolts (10 volts ÷ 65,536 ADU).

Errors in excess of 10 millivolts may result from radiant energy detector dark current, preamplifier bias and offset voltages, plus digitizer offsets. Such an error can completely mask the low end of the transmittance data. The A/D converter circuit of the invention must substantially eliminate these errors.

Further, the apparatus of the invention must present the digitized transmittance signals to a central processor for conversion to absorbance data, processing, storage, etc. at a high rate. Lengthy periods between sample measurements are not available in which to perform error correction.

Errors related to gain are inconsequential in the A/D converter because they cancel one another during the conversion from digital transmittance to digital absorbance data. Thermal variations are negligible because the chemical reactions occuring in the cuvettes require a stable thermal environment which also is provided to the A/D converter circuitry.

The apparatus and method of the invention then must provide an A/D converter that is highly accurate, fast and that produces offset-error free transmittance data in digital format.

SUMMARY OF THE INVENTION

In accordance with the invention, offset-error auto-zeroing is provided in a single-ramp A/D converter circuit by having the clock pulse counter count in one direction during a calibrate interval to record the offset-error value and having the counter count in the opposite direction from the offset-error value during a subsequent measurement interval. The detector and A/D converter offset-error effectively substracts out resulting in auto zeroed transmittance digital data.

Measurement of the analog transmittance of the electromagnetic radiation through the fluids of the cuvettes and concurrent A/D conversion occurs during light sampling intervals. The light sampling intervals occur when the cuvettes are aligned with the beam of electromagnetic radiant energy and are indicated by a $\overline{STROBE}$ signal. The peak of the analog transmittance signal will occur at some indeterminate time during the $\overline{STROBE}$ signal.

Dark sampling intervals when the beam of radiant energy is blocked from the detector occur between the light sampling intervals. During at least one of the dark sampling intervals representing calibrate interval, the electromagnetic radiant energy detector and the entire A/D converter circuit is operated with the counter counting down to record the offset-error produced thereby. During subsequent light sample intervals, the counter begins counting in the opposite direction from this offset-error count to zero and beyond to count the correct, auto-zeroed transmittance data value.

In the most general terms, the detector and A/D converter are operated in one direction to determine the offset-error and then the offset-error value is used to auto-zero the transmittance data values.

A single-ramp A/D converter is used with minimal addition of circuitry. The detector and A/D converter are operated in their normal timing sequence with the counter operating either up or down depending upon the interval, either measurement or calibrate.

The calibrate interval may occur between every measurement interval or it may occur less frequently with the offset-error count being loaded into the counter prior to each measurement interval.

BRIEF DESCRIPTION OF THE DRAWING

FIG. 1 is a fragmentary median sectional view through the photometric data components of a chemical analyzer of the invention;

FIG. 3 is a timing diagram illustrating the time relationships of the occurrence of the signals in the A/D converter.

DESCRIPTION OF THE PREFERRED EMBODIMENT

Figure 2:
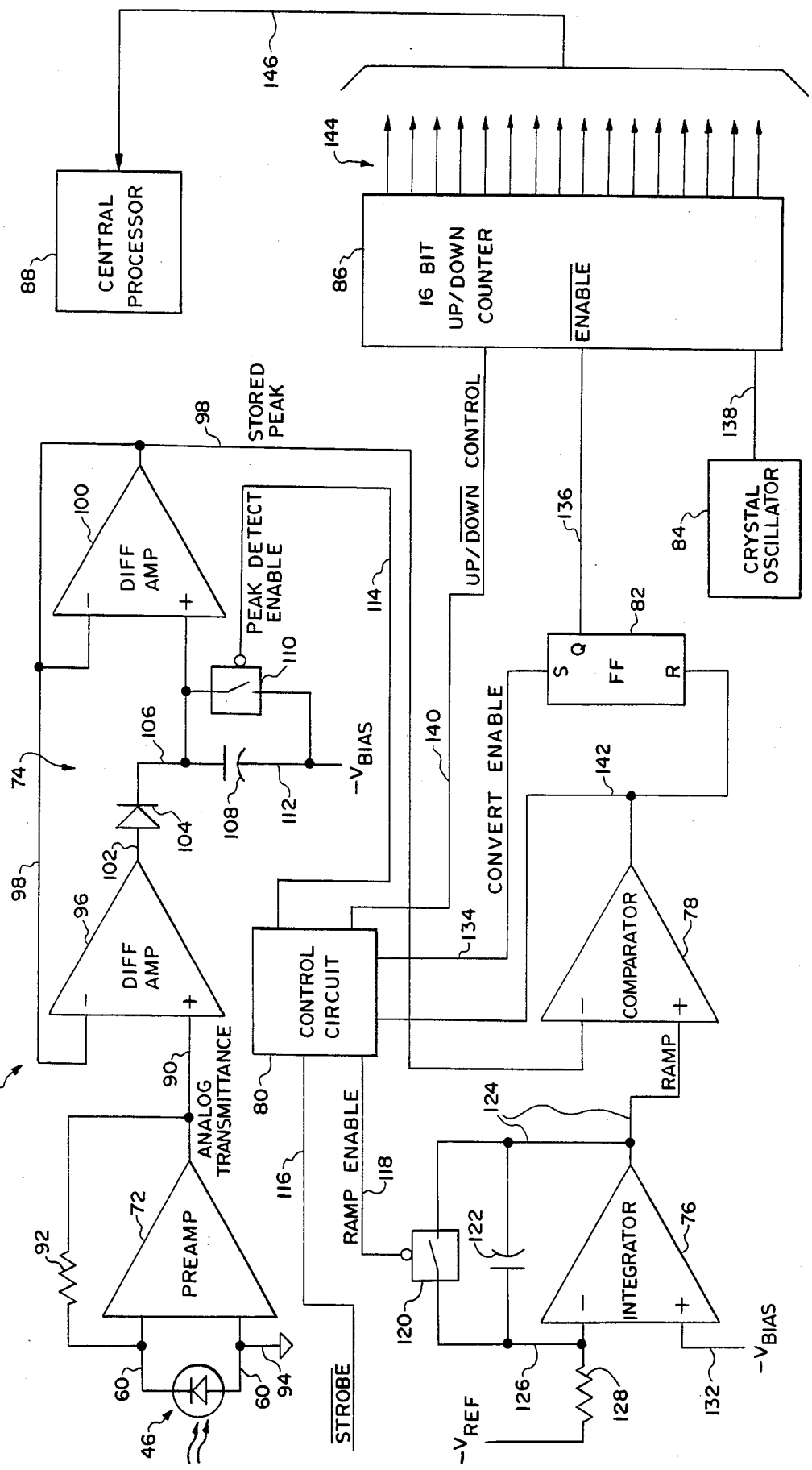
FIG. 2 is a schematic block diagram of the A/D converter circuit of the invention and its coupling to a central processor.

The invention herein is described in conjuction with a chemical analyzer in which known quantities of sample fluids and particular reagents are inserted in individual cuvettes. Reactions that occur in the individual cuvettes are monitored by measuring the light transmittance through the cuvettes and reacting sample fluids and reagents. The analog transmittance data from the cuvettes then is digitized and converted to absorbance data.

The change in absorbance of light by the samples and reagents in the cuvettes over time is indicative of the progress of the reactions occurring in the cuvettes and provides data indicative of the characteristics of the sample fluid.

Qualitatively, reference may be made to either the transmittance or absorbance data to describe the reactions occurring in the cuvettes. This is because a specific conversion relationship exists between these two types of data. Quantitatively, however, the terms transmittance and absorbance are not interchangeable because the relationship between them is logarithamic.

Determination of sample fluid characteristics is best made with absorbance data or data that has been converted to the absorbance domain. The data, from the detector and the A/D converter, both analog and digital, described herein is in the transmittance domain. The transmittance domain data is transferred or transmitted to a central processor that converts it to the absorbance domain. The transmittance domain data described herein is directly related to the amount of electromagnetic radiation transmitted through the sample fluid and reagent containing cuvettes.

The invention described herein is not limited to use with a chemical analyzer and, in particular, to make data acquisitions of transmittance or absorbance data from a beam of light passing through a cuvette. The invention is applicable to all data transformations from any form to an analog intermediate and ultimately to digital form. In particular, the invention is applicable to single ramp analog to digital converters where the converter inherently normally introduces an offset error in the digital output.

In the context of the invention, the term "auto-zeroing" is equivalent to the term "offset-error free". Both of these terms refer to the same phenomenon, i.e. a removal of the offset errors introduced by the circuitry of the A/D converter into the output data from the converter.

Figure 1:
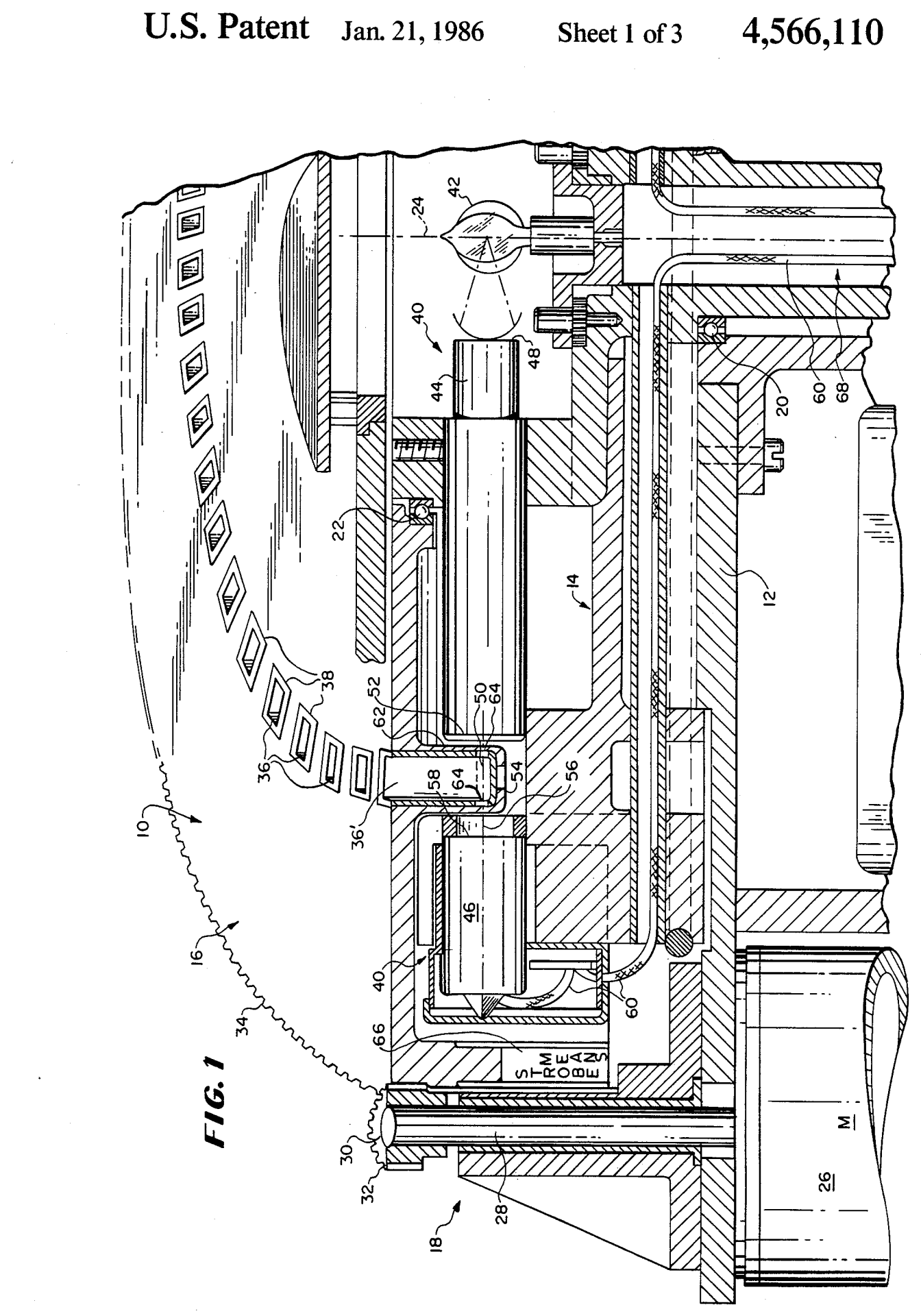

Referring to FIG. 1, a chemical analyzer with which the invention is used is designated generally by the reference character 10. Analyzer 10 comprises a frame 12, light sensor rotor 14, cuvette turntable 16 and turntable drive means 18.

Frame 12 carries rotor 14 through bearing 20 and rotor 14 in turn carries turntable 16 through bearing 22. Rotor 14 and turntable 16 are concentrically arranged for rotation around a central axis 24.

Frame 12 further carries turntable drive means 18 comprising a motor 26, drive shaft 28 and pinion gear 30. The teeth 32 of gear 30 mate with teeth 34 formed at the periphery of turntable 16. Drive means 18 are for rotating turntable 16 as desired, by stepping motion or continuously. Rotor 14 also is driven in rotational movement by drive means not shown.

Turntable 16 carries a plurality of reaction vessels or cuvettes 36. Cuvettes 36 are formed of material that is at least partially transparent and are formed integrally with turntable 16 or are independently fabricated and installed in ports 38 of turntable 16. Rotating turntable 16 moves the cuvettes 36 past work stations such as for loading, unloading and cleaning providing in effect a continuous supply of cuvettes.

At the loading work station known quantities of sample fluids and certain reagents are deposited into the cuvettes. The chemical reactions that occur in the cuvettes between the sample fluids and reagents are monitored by sensing over a time interval the quantity of radiant energy of one or more wave-lengths that is transmitted through the cuvettes and contained fluids. It is preferable that several sensor data values be taken over the time interval to obtain more precise data reflecting the characteristics of the sample fluids.

Light sensor rotor 14 carries a plurality of sensors or detectors such as 40. Each sensor includes a lamp 42 located on the axis 24 of both the rotor 14 and turntable 16, an optical tube 44 and a photodiode 46 or other type of light sensing means. Lamp 42 is common to all of the sensors and provides radiant energy at a wavelength of wavelengths that are useful for monitoring the chemical reactions that are occurring in cuvettes 36.

Optical tube 44 collects the light or radiant energy from lamp 42 at its one end 48 proximate lamp 42 and focuses it with a contained lens system to emit a beam 50 of said light or radiant energy at its opposite end 52 proximate the annular path traversed by the cuvettes 36. Tube 44 may include a filter for passing only desired wavelengths of light.

Beam 50 is directed through the lower portion 54 of each cuvette such as 36' and the sample and reagent fluids carried therein. The energy of beam 50 is partially absorbed by the material of the walls of cuvette 36' and by the fluids contained therein. The unabsorbed energy of beam 50 is transmitted to photodiode 46 in the form of transmitted beam 56.

Transmitted beam 56 strikes the face 58 of photodiode 46 which, in turn, produces an analog electrical signal on leads 60 that is proportional to the amount of energy striking face 58.

Cuvettes 36 are mounted in a depending portion 62 of turntable 16. Depending portion 62 is provided with windows 64 at each cuvette location to provide for entrance of beam 50 and exit of beam 56 to and from the cuvettes. At all other locations the material of depending portion. 62 is opaque and portion 62 therefore acts as a stop or shutter to prevent radiant energy from lamp 42 from striking face 58 of photodiode 46.

Strobe signal means 66 are located peripheral of turntable 16 but inward of drive shaft 28 to provide a strobe signal indicating alignment of a cuvette 36 with the beam 50. The strobe signal, when valid, indicates the interval during which the analog signal from the sensor will be valid and further when it will be a maximum value.

Strobe signal means 66 may comprise a depending code skirt, or light source and a sensor, such as are disclosed in U.S. Pat. No. 4,305,723, incorporated herein by reference, or otherwise as desired. The code skirt may provide identifying information to a central processor for identifying each of the digital transmittance data transmitted to it.

The turntable 16 and rotor 14 are rotated relative to one another and frame 14 to monitor the reactions occurring in cuvettes 36 a plurality of times for each revolution of turntable 16. Alternatively, rotor 14 may comprise only one sensor 40 and may be fixed relative to frame 12.

In any event, the analog transmittance signal from photo-diode 46 on leads 60 varies with time due to the relative rotation of turntable 16 and rotor 14. When beam 50 is out of alignment with a cuvette, the depending portion 62 blocks the beam and the analog signal on leads 60 is minimal, usually only the dark current of photodiode 46. As beam 50 comes into central alignment with windows 64 and cuvette 36', the analog signal on leads 60 increases from the minimum value to a peak value when the beam 50 and cuvette 36 are propery aligned. The analog signal on leads 60 then decreases to the minimal value as rotation of turntable 16 and rotor 14 moves the beam 50 away from alignment with cuvette 36'. This monitoring or measurement period or interval is referred to as the cuvette or light sample interval. A $\overline{\text{STROBE}}$ signal from the strobe means 66 is provided by the analyzer 10 for the duration of the light sample period by suitable alignment of the strobe means light sensor and depending code skirt carried by the turntable 16.

The light sample intervals and rise and fall times of the analog signal on lead 60 have a duration that is dependent upon the speed at which the turntable 16 and rotor 14 are moving relative to one another. At a slower speed the duration will be longer than at a high speed.

Of course, the analog signals on leads 60 will occur seriatim as the sensor 40 passes each cuvette, and multiple analog signals may be provided simultaneoulsy from multiple sensors such as 40. The concentricity of turntable 16 and rotor 14 and the alignments of the cuvettes 36 and sensors 40 provide for repeatable transmittance data to be obtained concerning the sample fluids from the several cuvettes 36 and sensors 40.

Leads 60 extend inward radially of rotor 14 and then pass axially through a space 68 down to circuitry that is carried by and rotates with rotor 14. This circuitry provides for pre-amplification of the analog signal on leads 60 and A/D conversion of said amplified analog signal carrying transmittance information obtained from each cuvette 36 by way of beam 56. After digital conversion the transmittance information in the form of data values is transmitted across sliding contacts to a central processing unit. Conversion to digital form before transmission across the sliding contacts is important to avoid transmitting analog signals across the sliding contacts.

It will be understood that transmittance information is carried by beam 56, the analog signals on leads 60, the signals in the A/D converter and the output from the A/D converter transmitted to the central processor, no matter in what form that information exists.

In FIG. 2, an auto-zeroing, linear A/D converter is indicated generally by the reference character 70. Converter 70 comprises pre-amplifier 72, peak detector 74, integrator 76, comparator 78, control circuit means 80, flip flop 82, crystal oscillator 84 and 16 bit up/down counter 86. The inputs to converter 70 are the analog signal on leads 60 from photodiode 46 and a $\overline{\text{STROBE}}$ signal from the strobe means 66. The output of converter 70 is a transmittance data word that is 16 bits wide and that is transmitted or transferred to a central processor 88.

The analog signal on leads 60 from photodiode 46 is input to pre-amplifier 72 to convert the current signal on leads 60 to a voltage signal at the output of pre-amplifer 72 on lead 90. The output on lead 90 is connected back to the input on one of leads 60 by a resistor 92. The other of leads 60 is connected to signal ground by lead 94. The signal on lead 90 is referred to as ANALOG TRANSMITTANCE and an idealized wave form of this signal is illustrated in FIG. 3, as are several other idealized waveforms of signals used or produced in converter 70. The output of pre-amplifier 72 is set to have a range of about 0 to +10 volts with a 0% transmittance information being represented by 0 volts and 100% transmittance information being represented by +10 volts.

The signal on lead 90 is applied to the positive input of differential amplifier 96 of peak detector 74. The negative input of amplifier 96, appearing on lead 98, is referred to as STORED PEAK and is output by differential amplifier 100 of peak detector 74. The signal STORED PEAK on lead 98 also is applied to the negative input of amplifier 100 and the negative input of comparator 78.

The output of amplifier 96 is carried on lead 102 to the anode of diode 104 and then by lead 106 to one side of a capacitor 108, the positive input of amplifier 100 and one side of a switch 110. The other sides of capacitor 108 and switch 110 are connected together to a negative bias voltage level $-V_{BIAS}$ by lead 112. A signal PEAK DETECT ENABLE is applied on lead 114 to the control input of switch 110 from control circuit 80.

The voltage $-V_{BIAS}$ is selected to be more negative than the greatest circuit offset errors anticipated. This provides that all signal and circuit offsets are presented to the peak detector as positive levels.

A cuvette sample interval begins at $t_1$, with the $\overline{\text{STROBE}}$ signal on lead 116 going to a low state, and the signal PEAK DETECT ENABLE going to a high state to hold the contacts of switch 110 open. This causes the output of amplifier 96 on leads 102, 106 to charge capacitor 108 from the $-V_{BIAS}$ voltage level in response to the signal ANALOG TRANSMITTANCE applied to the input of amplifier 96. The charge stored on capacitor 108 will increase from the $-V_{BIAS}$ voltage, which in this case is $-100$ millivolts, to the voltage level representing the peak voltage (+8 volts, the example of the wave forms of FIG. 3), of the ANALOG TRANSMITTANCE signal, and no higher. The charge on capacitor 108 is sensed by the high impedance positive input of amplifier 100 which tracks the same and outputs it on lead 98. Thus in FIG. 3, the signal STORED PEAK appearing on lead 98 closely tracks the rise and amplitude of the signal ANALOG TRANSMITTANCE on lead 90. The charge on capacitor 108 remains constant after the peak and during the fall time of the signal ANALOG TRANSMITTANCE. Capacitor 108 will effectively hold the charge on it until $t_3$ when the PEAK DETECT ENABLE signal on lead 114 goes to a low state, closing the switch 110 contacts and short-circuiting the charge on capacitor 108 to $-V_{BIAS}$. The signal STORED PEAK on lead 98 always tracks the voltage or charge on capacitor 108 and accordingly also returns to $-100$ millivolts or $-V_{BIAS}$.

The cuvette sample interval ends and a cuvette convert interval begins at $t_2$ with the signal $\overline{\text{STROBE}}$ going to a high state. This cause control circuit 80 to produce a signal RAMP ENABLE at a high state on lead 118. Lead 118 is connected to the control input of switch 120 and the signal RAMP ENABLE going to a high state opens the contacts of the switch. Switch 120 is connected in parallel with a capacitor 122 to the output of integrator 76 on lead 124 and to the negative input of integrator 76 on lead 126. Lead 126 also is connected to a negative reference voltage level $-V_{REF}$ through resisitor 128 and lead 130. The positive input of integrator 76 is connected to $-V_{BIAS}$ by lead 132.

When the contacts of switch 120 are opened at $t_2$, integrator 76 produces a signal on lead 124 referred to as RAMP that increases linearly over time from the $-V_{BIAS}$ voltage level of $-100$ millivolts, see FIG. 3. The RAMP signal on lead 124 is applied to the positive input of comparator 78 while the STORED PEAK signal is applied to the negative input thereof.

At the same time that the control circuit 80 causes the signal RAMP ENABLE to go to a high state, circuit 80 also causes a high state signal pulse called CONVERT ENABLE on lead 134 to be applied to the set (S) input of flip flop (FF) 82. See FIG. 3. This causes the Q output of flip flop 82 on lead 136 to go to a low state, enabling counter 86 to count from zero the clock pulses on lead 138 from crystal oscillator 84. Counter 86 counts from zero either up or down depending whether the UP/$\overline{\text{DOWN}}$ CONTROL signal on lead 140 from circuit 80 is in a high state or low state. During a cuvette sample or convert interval, the signal UP/$\overline{\text{DOWN}}$ CONTROL will be in a high state for the duration of the A/D conversion process. See FIG. 3. A calibration interval has not yet occurred.

The RAMP signal on lead 124 increases until $t_3$ when it equals the voltage level of the STORED PEAK signal on lead 98. In FIG. 3, this is +8 volts. At that time the output of comparator 78 on lead 142, which had been at a low state, goes to a high state. This is applied to the reset R input of flip flop 82 and causes the Q output to go to a high state, disabling the counter 86 and stopping it from counting any further pulses from oscillator 84. This high signal from comparator 78 also is applied to circuit 80 that, in turn causes the PEAK DETECT ENABLE and RAMP ENABLE signals to go to a low state, closing the contacts of switches 110 and 120 and resetting the STORED PEAK and RAMP signals to a voltage level of −100 millivolts or −$V_{BIAS}$. This, in turn, causes the output of comparator 78 to go to a low state. All of this occurs rapidly so that the output of comparator 78 appears as a high state pulse.

The detection and conversion of the transmittance information from one cuvette thus is performed. The sixteen outputs 144 indicating the binary count of counter 86 are transmitted in parallel over leads 146 to central processor 88. The outputs 144 form one binary digital word representing transmittance data and that one datum value represents the relative transmittance of light through a cuvette 36 plus or minus all offset and scaling errors introduced by photodiode 46 and converter circuit 70. This detector and A/D conversion process is repeated for each cuvette as many times as is desired to obtain enough information to determine the characteristics of the sample fluid.

The conversion from transmittance to absorbance occurs in processor 88 in a manner that will be discussed, and results in the elimination of all scale errors in the data presented on output leads 144 from counter 86.

The classical relationship between the percentage of transmittance and absorbance is:

---

(1) % TRANS = $10^{(2-ABS)}$
Where: % — percentage,
TRANS — Transmittance, and

ABS — Absorbance
Thus:
(2) ABS = 2-log(% TRANS)
Defining:
(3) $ABS_{cuvblank}$ = Absorbance of cuvette containing de-ionized water
and (4) $ABS_{total}$ = Absorbance of cuvette containing sample and reagents
The, the absorbance of the sample and reagents is determined to be:
(5) $ABS_{sample} = ABS_{total} - ABS_{cuvblank}$
Substituting:
(6) $ABS_{sample} =$
[2-log(% $TRANS_{total}$)] − [2-log(% $TRANS_{cuvblank}$)]
or: (7) $ABS_{sample} =$
log(% $TRANS_{cuvblank}$) − log(% $TRANS_{total}$)
or: (8) $ABS_{sample} = \log \frac{(\% TRANS_{cuvblank})}{(\% TRANS_{total})}$

---

Thus, to determine the absorbance datum of any sample in processor 88, only the transmittance of the blank cuvette need be determined as a starting point. All later transmittance data are compared to it, and all scale factors, such as amplifier gains, divide out because from any one detector and A/D converter the scale factors included in the numerator and denominator of formula (8) are identical or equal.

A factor such as bulb aging is negligible because the data are obtained over a short period of time. Temperature variation does not exist because a constant temperature atmosphere that is provided for the reactions in the cuvettes, also is provided for the detector and A/D converter.

Thus, the main error remaining is offset; this is eliminated in the A/D converter 70.

A dark sample interval occurs between each cuvette sample interval. The light sample and convert intervals occur between times $t_1$ and $t_4$ of FIG. 3 and thus, the dark sample and convert intervals occur between $t_5$ and $t_1$ of FIG. 3. This corresponds with depending portion 62 blocking all of beam 50 from photodiode 46.

Thus, no light strikes photodiode 46 and only photodiode 46 and A/D converter 70 circuit effects such as offsets are determined during a dark sample interval.

The last event of any cuvette convert interval is determined by the RAMP signal on lead 124 charging up to +10 volts, its maximum amplitude. This represents 100% transmittance and occurs no later than time $t_4$ of FIG. 3. When this occurs, the circuit 70 will be reset to a condition ready to process the next transmittance information.

The first event of a dark sample interval occurs a short time after $t_4$, at $t_5$ with the UP/$\overline{DOWN}$ CONTROL signal going to a low state indicating that the counter is to count down rather than up. Thereafter, at $t_6$ the PEAK DETECT ENABLE signal on lead 114 goes high enabling peak detector 74 to detect and hold the peak offset error voltage from the photodiode 46.

The RAMP ENABLE signal on lead 118 goes to a high state at $t_7$ ending the dark sample interval and starting the RAMP signal on lead 124. Concurrently, with RAMP ENABLE going high, the CONVERT ENABLE signal on lead 134 is pulsed high causing counter 86 to start counting clock pulses from oscillator 84. Because the UP/$\overline{DOWN}$ CONTROL SIGNAL is in the count down state, counter 86 counts down from zero.

A short time thereafter, corresponding to a small offset-error, the RAMP signal amplitude equals the amplitude of STORED PEAK and comparator 78 outputs a positive pulse to again reset the circuit 70 as has been described before. This occurs at $t_8$. The count of counter 86 carried on leads 144 now represents the negative offset error voltage of the photodiode 46 and the A/D converter circuit 70.

This negative count is not transmitted to processor 88 but is retained in counter 88. The signal UP/$\overline{DOWN}$ CONTROL returning to a high state at $t_9$ is the last event to occur in a dark sample and convert interval. The dark convert interval is from $t_7$ to $t_8$.

During the next cuvette or light sample interval, photodiode detector 46 and A/D converter 70 again operate as has been described, but with counter 86 counting up from the negative offset-error count contained therein from the previous dark sample interval. Counter 86 counts up from the negative offset-error count, through zero and into positive numbers to provide the transmittance datum.

The determined offset-error of the photodiode 46 and A/D converter is in effect subtracted from the count obtained in counter 86 and the count output by counter 86 is an offset-error free, auto-zeroed, digital transmittance datum. This datum then is transmitted to processor 88 where it is used to provide absorbance data in determining the characteristics of the sample fluid.

In effect, the offset-error correction scheme may be described by the equation:

−Offset+(Signal+Offset)=Signal        (9)

The offset error of the data acquistion and A/D conversion system of the invention is eliminated by a double sampling process. In one sample, all of the system offsets are determined separate from any data acquisition and then in the next data acquisition sample the offsets are subtracted from the sampled information-plus-offset measurement.

The offset-error elimination procedure is fast, being performed at the same rate as the data acquisition but between acquisitions when the A/D converter 70 normally is quiescent, and is accurate, being limited only by the resolution of the A/D converter 70 itself.

Additional circuitry for performing the offset elimination is minimal. Control circuit 80 normally provides the timing of the single ramp A/D converter 70 with timers as are desired. The only additional circuitry needed is that involved in circuit control 80 for toggling the UP/$\overline{\text{DOWN}}$ CONTROL signal before and after a dark sample interval and for starting a conversion process during a dark sample interval. This generally concerns minimal additional timing circuitry and not additional measurement or compensation circuitry, as is required in multiple-slope A/D converters.

The offset-error elimination procedure and A/D conversion may be performed otherwise than as described. The offset-error may be determined not at every dark sample interval between cuvette sample intervals but less frequently as desired, with the counter 86 being set to the negative offset-error count prior to each cuvette sample interval data acquisition. The offset error count further may be transferred to processor 88 where it is subtracted from subsequent cuvette sample interval data acquisitions. One important feature of the invention remains, however, the dark sample interval determination of the offset-error count and the later use of the offset-error count to correct the count of a cuvette sample interval data acquisition, either during or after the data acquisition. Typically, the correction occurs in the last stage of the A/D conversion, the counting of clock pulses from the oscillator 84. No manipulation occurs in the stages of the A/D converter other than the counter 86 to provide this correction feature.

Further modifications of the disclosed embodiment include sensing other than the peak amplitude of the ANALOG TRANSMITTANCE signal, and setting $-V_{BIAS}$ to $-100$ millivolts. For example, the signal ANALOG TRANSMITTANCE may be applied to an integration circuit rather than peak detector 74.

Another feature of the invention is that the offset-error elimination occurs by subtraction of the offset-error value, or addition of the negative offset-error value in the transmittance domain. Subtraction or addition of the negative offset-error cannot properly occur in the absorbance domain. This is due to logarithmic conversion that occurs in converting transmittance data to absorbance data. Addition or subtraction of absorbance data values is the equivalent of multiplying or dividing the corresponding transmittance data values. Subtraction or addition of the offset-error value is not available in the absorbance domain.

In broad terms the invention can be applied to any analog to digital converter for the elimination of offset errors normally introduced into the digital output. Any input information, such as from a photosensor sensing a beam of radiant energy, can be blocked for a moment and the converter operated with the counter counting down to determine the offset error. During the next measurement interval the determined offset error effectively is substracted from the input information to produce auto-zeroed digital information.

I claim:

1. A method of generating reaction effect data in the form of offset-error free digital transmission data derived by directing a beam of radiant energy through a plurality of cuvettes containing reaction samples, the cuvettes being partially transparent, the method comprising:

A. scanning the cuvettes seriatium with the beam during cuvette sample intervals by passing the beam through the cuvettes containing reaction samples and directing the light transmitted therethrough to a sensor;
   B. blocking the beam from passing to the sensor during at least one dark sample interval occurring other than during cuvette sample intervals;
   C. generating from said sensor representative analog cuvette and dark transmittance signals representing, respectively, the quantity of light from said beam striking said sensor during said cuvette sample interval and during said at least one dark sample interval;
   D. converting said representative analog cuvette and dark transmittance signals to digital cuvette and dark transmittance signals, said digital cuvette transmittance signals including an offset-error value and said digital dark transmittance signal representing the offset-error value; and
   E. using the digital dark transmittance signal that represent the offset-error value to eliminate the offset-error value included in the digital cuvette transmittance signals.

2. The method of claim 1 in which using the digital dark transmittance signal includes counting in a counter in one direction to a dark transmittance count representing the dark transmittance signal and said offset error and counting in said counter in an opposite direction from said dark transmittance count to a cuvette transmittance count representing the cuvette transmittance signal.

3. The method of claim 1 in which using the digital dark transmittance signals includes subtracting the dark transmittance signals from said cuvette transmittance signals.

4. The method of claim 1 in which the step of converting includes converting using a single-ramp converter.

5. The method of claim 1 in which blocking the beam includes providing a depending portion between cuvettes.

6. The method of claim 1 further including producing a strobe signal indicating the cuvette sample interval and the dark sample interval.

7. A method of producing, from a beam of radiant energy having certain time varying quantities of radiant energy, offset-error free digital beam signals where the signal values represent said certain quantities, said beam being directed onto and striking a sensor, said sensor converting said quantities of radiant energy into representative amplitude analog beam signals, said analog beam signals being converted to digital beam signals in an analog to digital converter that introduces offset-error values, the method comprising:

A. blocking said beam from striking said sensor during at least one dark sample interval;
   B. producing from said sensor an analog dark interval signal during said dark sample interval;
   C. converting in said analog to digital converter said analog dark interval signal to a digital dark interval signal that represents the offset error value of said sensor and converter; and D. using said digital dark interval signal to eliminate the offset-error value that otherwise would be included in said digital beam signal.

8. The method of claim 7 in which using the digital dark interval signal includes counting in a counter of the converter in one direction to a dark interval count representing the dark interval signal and said offset error and counting in said counter in an opposite direction from said dark interval count to a beam count representing the beam signal.

9. The method of claim 7 in which using the digital dark interval signal includes subtracting the dark interval signal from said beam signal.

10. The method of claim 7 in which the step of converting includes converting using a single-ramp converter.

11. The method of claim 7 further included producing a strobe signal indicating the dark sample interval.

12. A method of producing offset-error free digital output signals from radiant energy input information to a sensor which introduces offset errors, in an analog to digital converter that also introduces offset-errors, the method comprising:
A. blocking said input information from a radiant energy sensor during a dark sample interval when said sensor generates an analog dark interval signal containing said offset errors input to said converter;
B. producing a digital dark interval output signal during said dark sample interval, said dark interval output signal representing the offset-error of said sensor and said analog to digital converter; and
C. using said digital dark interval output signal to digitally eliminate the offset-error of said sensor and said analog to digital converter that otherwise would be introduced into said digital output signals.

13. The method of claim 12 in which using the digital dark interval output signal includes counting in a counter in one direction to a dark interval count representing the dark output signal and said offset error and counting in said counter in an opposite direction from said dark interval count to an output count representing the output signal.

14. The method of claim 12 in which using the digital dark interval output signal includes subtracting the dark interval output signal from said output signals.

15. The method of claim 12 in which the step of producing includes using a single-ramp converter.

16. The method of claim 12 further including producing a strobe signal indicating the dark sample interval.

17. An apparatus for generating reaction effect data in the form of offset-error free transmission data derived by directing a beam of radiant energy through a plurality of cuvettes containing reaction samples, the cuvettes being partially transparent, the apparatus comprising:
A. rotor means for scanning the cuvettes seriatim with said beam and directing the unabsorbed radiant energy that is transmitted through each cuvette and its reaction sample during cuvette sample intervals onto the face of sensor means;
B. blocking means for blocking the beam from the face of said sensor means during dark sample intervals occurring between cuvette sample intervals;

C. said sensor means for sensing the quantity of radiant energy striking its face and generating representative analog cuvette transmittance signals during said cuvette sample intervals and at least one analog dark transmittance signal during one of said dark sample intervals;
D. analog to digital converter means for converting said analog cuvette and dark transmittance signals from said sensor means to digital cuvette and dark transmittance signals, said converter means introducing offset-errors into said digital signals; and
E. control means for eliminating the off-set error in said digital cuvette transmittance signal with said digital dark transmittance signal.

18. The apparatus of claim 17 in which said converter includes counter means for counting over periods to output said digital signals, said digital dark transmittance signal representing the offset error, wherein said counter means can count in two opposite directions and said control means cause said counter means to count in one direction to a dark transmittance count representing the offset error during at least one dark sample interval and in the other direction during a cuvette sample interval from said dark transmittance count.

19. The apparatus of claim 17 in which the converter means are a single-ramp converter.

20. A system for producing offset-error free output signals including analog to digital converter means producing digital output signals but introducing offset errors from radiant energy input information to a sensor which also introduces offset errors, the system comprising:
A. radiant energy sensor means for sensing said input information to generate an analog light interval signal input to said analog to digital converter means during a light interval, and for generating at least one analog dark signal input to said analog to digital converter during a dark interval when said input information is blocked from said sensor means;
B. means for blocking said input information from said sensor means during said dark interval;
C. said analog to digital converter means including means for converting said analog light interval signal to a digital output signal and for converting said analog dark signal to a digital dark output signal containing said errors in digital form; and
D. control means for eliminating said offset-errors in said digital output signal using said digital dark output signal.

21. The system of claim 20 in which said control means includes counter means for counting in two opposite directions, said control means causing said counter means to count in one direction to a dark count representing the offset error during said dark interval and to count in the other direction during said light interval from said dark count.

22. The system of claim 20 in which the converter is a single-ramp converter.

23. The method of claim 1 in which the step of converting includes starting from a negative bias voltage.

24. The apparatus of claim 17 in which said converter means include a negative bias voltage.